US 7,425,848 B2

(12) United States Patent
Schaffer et al.

(10) Patent No.: US 7,425,848 B2
(45) Date of Patent: Sep. 16, 2008

(54) INTEGRATED DRIVER CIRCUIT STRUCTURE

(75) Inventors: Viola Schaffer, Erlangen (DE); Rodney T. Burt, Tucson, AZ (US); Jürgen Metzger, Pliezhausen (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/383,413

(22) Filed: May 15, 2006

(65) Prior Publication Data

US 2006/0255841 A1    Nov. 16, 2006

(30) Foreign Application Priority Data

May 13, 2005    (DE) .................. 10 2005 022 338

(51) Int. Cl.
*H03B 1/00*    (2006.01)
(52) U.S. Cl. ....................... 327/108; 323/284
(58) Field of Classification Search ................ 327/103, 327/108, 379, 389, 538, 540, 427, 430, 431, 327/432, 434, 435; 323/311, 312, 315, 316, 323/284; 326/82, 83, 86, 87
See application file for complete search history.

(56) References Cited

U.S. PATENT DOCUMENTS

| 4,185,236 A | 1/1980 | van de Plassche et al. |
| 6,005,414 A | 12/1999 | Reay |
| 6,704,050 B1 | 3/2004 | Washkurak et al. |
| 6,828,766 B2 * | 12/2004 | Corva et al. ................. 323/284 |
| 7,050,914 B2 * | 5/2006 | Tzeng et al. .................. 702/64 |
| 2005/0007075 A1 | 1/2005 | Woo et al. |

FOREIGN PATENT DOCUMENTS

| DE | 3123735 C2 | 3/1982 |
| EP | 0 359 315 A1 | 3/1990 |
| WO | WO 01/31663 A1 | 5/2001 |

OTHER PUBLICATIONS

TI Marketing, Industrial Solutions Guide, "Input/Output Cards, Internal Communication/Interface/Isolation, Core Logic," Texas Instruments, Jan. 5, 2005, pp. 34-35.
Burr-Brown Products from Texas Instruments Data Sheet, "Industrial Analog Current/Voltage Output Driver," Texas Instruments, Jun. 2005-Revised Mar. 2006, pp. 1-22; Package Option Addendum, pp. 1-4.

* cited by examiner

*Primary Examiner*—N. Drew Richards
*Assistant Examiner*—Diana J Cheng
(74) *Attorney, Agent, or Firm*—Warren L. Franz; Wade J. Brady, III; Frederick J. Telecky, Jr.

(57) ABSTRACT

An integrated circuit driver structure, comprising an amplifier, a current mirror block and an external current set resistor, is provided that is digitally configurable to operate in a current output mode or in a voltage output mode with its output level controlled by an external voltage. The current mirror block comprises multiple current sources, all having the same gate bias supplied by the output of amplifier. At any time, at least one current source is connected to supply the reference current to resistor, while all other current sources are connected to mirror the reference current to the load current output towards the load. A current gain ratio is based on the number of current sources connected to supply resistor and the number connected to mirror the reference current.

16 Claims, 1 Drawing Sheet

INTEGRATED DRIVER CIRCUIT STRUCTURE

FIELD OF THE INVENTION

The invention relates to an integrated driver circuit structure that is digitally configurable to operate in a current output mode or in a remote sense voltage output mode.

BACKGROUND OF THE INVENTION

In the field of industrial automation, programmable logic controllers and field extension modules control large numbers of electronic actuators. Due to the wide range of actuators and their different performance requirements a vast variety of signal drives exist, providing actuator signals with different ranges of drive voltage or current. In between these ranges many proprietary signal interfaces exist requiring the customization of the electronic drive to match the required actuator input.

In order to avoid separate board designs for each type of actuator, it is desired to have an integrated solution that provides accurate voltage controlled current and voltage supply with scalable output levels.

A conventional control loop needs a shunt resistor in order to measure the voltage drop across this shunt resistor and feed the result back into the negative input terminal of an amplifier, e.g., via an instrumentation amplifier and a resistor, thereby closing the current control loop.

SUMMARY OF THE INVENTION

The invention provides a driver circuit that overcomes the aforementioned limitations. Specifically, an integrated driver circuit structure is provided, the driver being digitally configurable to operate in a current output mode or in a voltage output mode, in particular with its output range preset by resistors and its output level controlled by an external voltage.

In a specific embodiment, the external control voltage determines the current available at the output terminal in the current output mode or the voltage available at the output terminal in the voltage output mode. The integrated circuit comprises an operational amplifier, a voltage-to-current converter and a current mirror. A first input of the operational amplifier is connected to the control terminal. The second input of the operational amplifier is connected across the external set resistor and to either the output of the current mirror or to the output of the voltage-to-current converter. The output of the operational amplifier provides the gate drives for the current mirror transistors. In the current output mode, the feedback is closed through the current mirror and the reference current generated across the set resistor is mirrored to the output terminal. The voltage-to-current converter has voltage sense inputs connected across the external load. In the voltage output mode, the feedback is closed through the output of the voltage-to-current converter setting the voltage at the output terminal.

In the current output mode, the reference current is mirrored to the load in a feed-forward arrangement, in particular via a dynamically matched current mirror, so that there is no need for a current control loop with a shunt resistor, instrumentation amplifier (INA) and voltage to current converting resistor. In particular, a dynamic element matching approach employed in the current mirror ensures high accuracy throughout a large range of the output current. Limitations to the voltage headroom or power efficiency at high output currents are eliminated. Although the gate driver which determines the reference current forced through the current set resistor preferably includes an operational amplifier which is part of a closed control loop, the feedback loop is short, which leads to a fast application. Typically, no additional (external) compensation is required for that loop.

The dynamic element matching implemented in the current mirror assures high accuracy without additional trim throughout a large output current range. Furthermore, the current dependence of the voltage headroom and of the power efficiency is nearly eliminated. Additionally the voltage-to-current converter (which is not used in the control loop) can be used to provide load voltage information.

In an embodiment, the current mirror includes multiple current sources all having the same gate bias supplied by the operational amplifier. At least one of the current sources is connected to supply said reference current to the external set resistor and all other current sources are connected to the output terminal.

In an advanced embodiment a clock-controlled switching arrangement is provided that cycles the at least on current source, connected to supply the reference current, through all of the current sources in the current mirror. This cycling can be done pseudo-randomly or following a certain pattern, e.g., to make sure that all current sources are selected a substantially equal number of times.

In a further embodiment the integrated circuit includes an internal switch for selectively connecting the output of the voltage-to-current converter to an input of the operational amplifier or to a voltage sense terminal.

In a further embodiment, the voltage-to-current converter comprises two additional terminals across which a scale resistor can be connected. The scale resistor allows the scale of the output voltage to be set independently from the scale of the output current. Independently selecting the ranges of the current and the voltage outputs can easily be accomplished by selecting an external resistor for the current range in the current output mode and another external resistor for the voltage range in the voltage output mode. Advantageously, the values of these resistors have no impact on the power efficiency to the load and the load voltage headroom.

It is also an embodiment that the device can be remotely configured via its interface connected to a bus-system.

In a further embodiment, the device can be used for fault and load impedance monitoring purposes. e.g., by monitoring distinct terminals of the device.

In yet a further embodiment, the device comprises a switch-off functionality, e.g., via its interface. Such an output disable capability can be easily implemented into the circuit by disabling the gate drive to the current mirror. Hence, no additional (external) switch is required and there will be no voltage drop across such a switch.

BRIEF DESCRIPTION OF THE DRAWINGS

Embodiments of the invention are shown and illustrated in the following figures.

DETAILED DESCRIPTION OF THE EMBODIMENT

Figure 1:
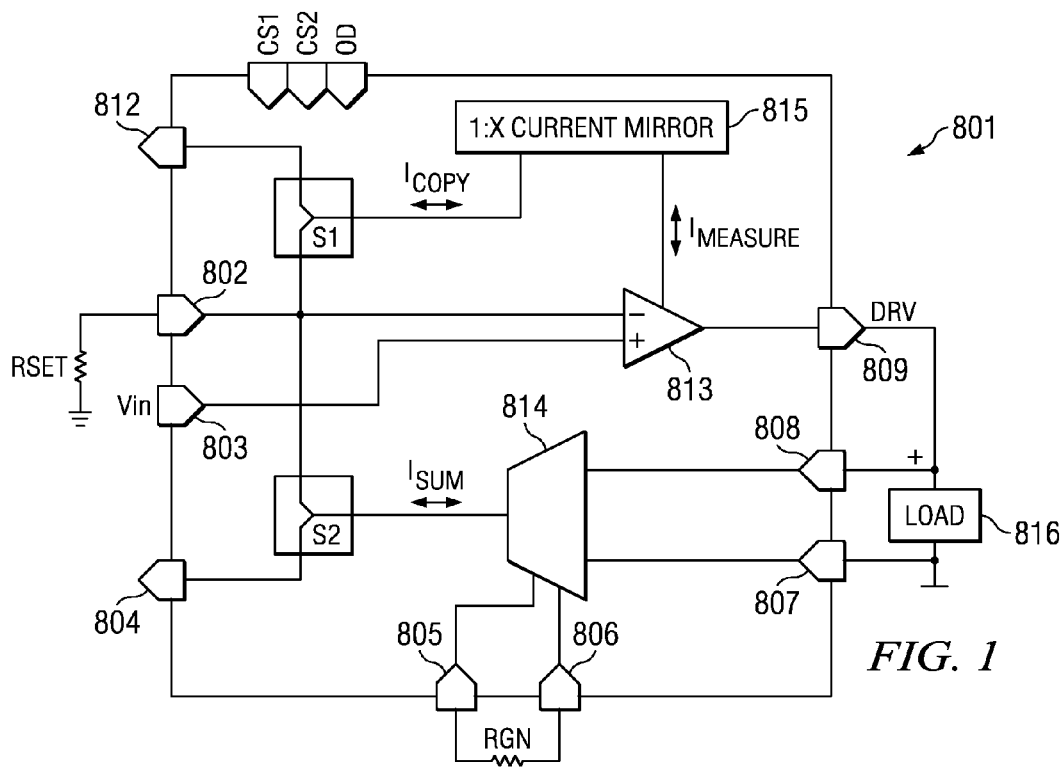
FIG. 1 shows an integrated circuit configurable to operate in a current output mode or in a voltage output mode, whereas the circuit is controlled by an external voltage and can be configured by a digital signal.

FIG. 1 shows an integrated driver circuit structure 801 (with terminals 802 to 809, CS1, CS2, OD and 812) comprising an amplifier 813 (with a negative and a positive input and an output), a current mirror block 815 and an external current set resistor RSET. The current set resistor RSET is connected to the negative input of the amplifier 813 via terminal 802 and ground GND. It is to be noted that the resistor RSET could, instead of being connected to ground GND, alternatively be connected to another reference voltage. The current set resistor RSET is generally off-chip but may be on-chip as part of the integrated circuit depending on application needs. A control voltage Vin is applied to the positive input of the amplifier 813 via terminal 803. The current mirror block 815 has a first output that can, via a switch S1, be connected to the node 802 between the negative input of the amplifier 813 and the resistor RSET. The current mirror block 815 has a second output to which a load 816 is connected through an output terminal DRV 809. The output of the amplifier 813 provides a gate control voltage to the current mirror block 815.

The current mirror block 815 comprises multiple current sources, all having the same gate bias supplied by the output of amplifier 813. At any time, at least one output of the number of current sources of the current mirror block 815 is connected to supply the reference current to the current set resistor RSET. All other current sources of the current mirror 815 are connected to mirror the reference current to the load current output towards the load 816. Thus, the current mirror 815 provides a current gain ratio based on the number of current sources connected to supply the reference current to the current set resistor RSET and based on the number of current sources connected to mirror the reference current towards the load 816. In the example shown, a ratio of 1:X means that a total of 1+X current sources are provided, wherein one current source is connected to supply the reference current to the current set resistor RSET and X current sources are connected to mirror the current to the load current output. It is to be noted that with regard to the ratio "1:X" that "X" does not need to be an integer and/or "1" does not need to mean "one" current source only. In other words, implementations with a ratio of "3:10", "4:20", "8:2", etc., are also possible.

In a preferred embodiment, to increase the accuracy for the current mirror, a method of dynamic element matching is applied. This is achieved by providing a clock-controlled switching arrangement which cycles the (at least one) current source connected to supply the reference current through all of the current sources of the current mirror. Transistor mismatch due to process variation can be significantly reduced by providing X+1 identical transistors as current sources and periodically switching (permutating) the selection of transistors that are actually connected to each side of the current mirror. The patterning, cycling among transistors can be done pseudo-randomly or following a definite pattern, e.g., to make sure that all current sources are selected a substantially equal number of times.

A voltage-to-current converter 814 is further provided, as shown in FIG. 1. Voltage-to-current converter 814 has two inputs respectively connected to terminals 807 and 808, across which the load 816 is connected. The voltage-to-current converter 814 also has an output that is connected to a switch S2 and it has two additional inputs connected to terminals 805 and 806, across which an external resistor RGN can be connected to set a current or voltage output scale of the voltage-to-current converter 814.

The terminals CS1, CS2 are used to select the mode of the power supply device. By applying a digital signal to these terminals, the circuit can be configured to operate either in the current output mode or in the voltage output mode. In addition, monitoring signals can be provided by the circuit, e.g., for supervision purposes of the circuit 801 and/or the load connected therewith.

In the current output mode, a reference current $I_{COPY}$ is routed from the current mirror block 815 via switch S1 to terminal 802, and the path from switch S1 to terminal 812 is open. This reference current is mirrored (and possibly amplified) in the current mirror block 815. The output current is responsive to the input voltage Vin, generating a voltage which is regulated across the resistor RSET by the amplifier, allowing $I_{COPY}$ to flow when at least one current leg of the current mirror is closed on that path. The amplifier 813, coupled to the output terminal 809, delivers a current towards the output terminal 809. Dynamic element matching, as described above, ensures the required accuracy for the current mirror. A current $I_{SUM}$ is routed from the output of the voltage-to-current converter 814 via switch S2 to the terminal 804, thereby providing a potential difference across a load, such as a resistor to ground, to be monitored at terminal 804. This pathway through 804 provides an independent way of monitoring the current at the output terminal 809.

In the voltage output mode, amplifier 813 couples to terminal 809 and delivers a voltage to terminal 809. Several possible application configurations and monitoring features exist. For example, the voltage at terminal 809 can be monitored by using 814 to sense a voltage across load 816. The current $I_{SUM}$ output of 814 is routed to terminal 802 via switch S2, thereby closing the feedback loop; and the path from terminal 804 to S2 is open. With a closed loop, the output voltage between the terminals 808 and 807 is responsive to and tracks the input voltage Vin. The magnitude of the voltage output can be adjusted further and be independent from the current output magnitude by the resistor RGN which adjusts the gain of 814 and the magnitude of $I_{SUM}$. Separately, the current $I_{COPY}$ is routed via switch S1 to terminal 812, and the pathway between S1 and terminal 802 is open. This separate configuration allows the load current at terminal 816 to be monitored via terminal 812.

Fault conditions can be detected or the load impedance can be monitored by observing the outputs of terminals 812 and/or 804.

Figure 2:
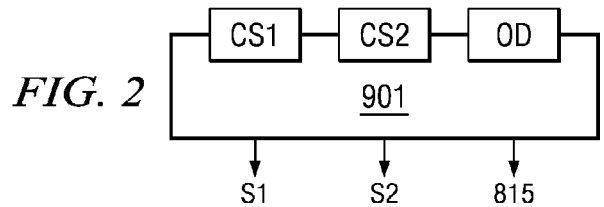
FIG. 2 shows an illustrative circuit with a plurality of current sources.

FIG. 2 shows an interface 901 of the power supply device. The interface contains control signals CS1, CS2 and OD and control outputs to switches S1 and S2 and to the current mirror block 815.

The control signal OD controls the output enable: High enabled, Low disabled. The control signals CS1 and CS2 control the configuration modes as follows: "00" is voltage mode (see FIG. 1: S1 connected to terminal 812 and S2 connected to terminal 802), "01" is current mode (see FIG. 1: S1 connected to terminal 802 and S2 connected to terminal 804), and "10" and "11" are used as configurable modes (see FIG. 1: S1 connected to terminal 812 and S2 connected to terminal 804). The difference between modes "10" and "11" is a set current limit.

Figure 3:
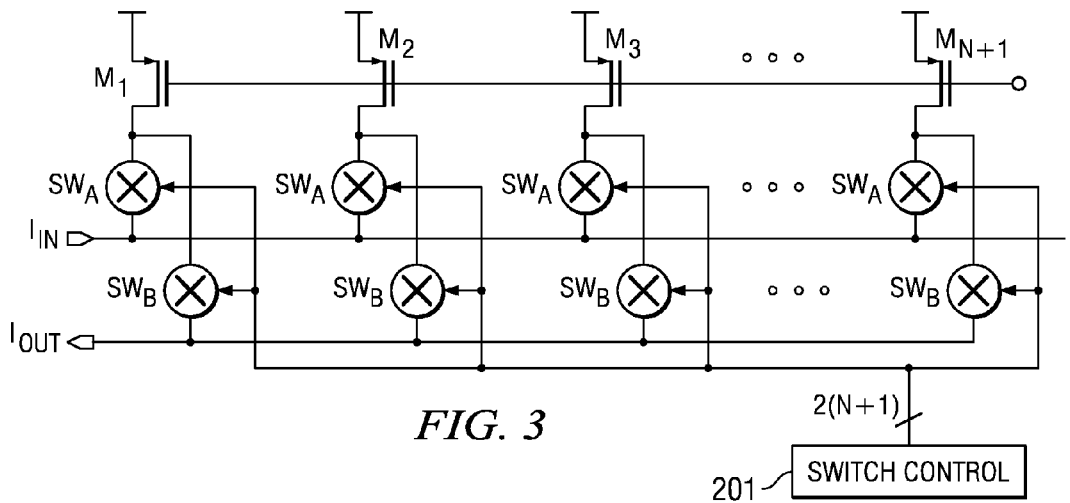
FIG. 3 shows an interface with digital configuration inputs and control outputs.

FIG. 3 shows an example circuit with multiple current sources $M_1, \ldots, M_{N+1}$. FIG. 3 comprises part of the current mirror circuitry 815 in FIG. 1. The current sources are PMOS transistors, the Sources of which are connected to a positive power supply rail. The Gates of the current sources are connected with each other and with a bias source. A current output $I_{IN}$, generally $I_{COPY}$ in FIG. 1, or a current input $I_{OUT}$, $I_{MEASURE}$ in FIG. 1, can be connected to the Drain of each PMOS transistor. Such connection is controlled by a switch control 201. Hence, each PMOS transistor has two switches $SW_A$ and $SW_B$ in series with its Drain that allows the Drain to be connected to either the input mirror leg or the output mirror leg.

Those skilled in the art to which the invention relates will appreciate that other and further modifications may be made to the described example embodiments, without departing from the scope of the claimed invention.

The invention claimed is:

1. An integrated driver circuit structure that is digitally configurable to operate in a current output mode or in a voltage output mode, with its output level controlled by an external voltage applied to a control terminal, wherein:
   the external control voltage determines the current available at an output terminal in the current output mode and the external control voltage determines the voltage available at the output terminal in the voltage output mode;
   the integrated circuit comprises an operational amplifier, a voltage-to-current converter and a current mirror;
   a first input of the operational amplifier is coupled to the control terminal;
   the voltage-to-current converter has voltage sense inputs coupled to respective terminals across which an external load is connected;
   in the current output mode, a second input of the operational amplifier is coupled to a reference current source of the current mirror and to a terminal to which an external set resistor is connected, the output of the operational amplifier supplying a gate bias to the current mirror and the current mirror mirroring the reference current to the output terminal; and
   in the voltage output mode, the second input of the operational amplifier is coupled to the output of the voltage-to-current converter and the output of the operational amplifier drives the output terminal to set the voltage across the load.

2. The integrated driver circuit of claim 1, further comprising first and second switches; the first switch coupling the reference current source of the current mirror to an output voltage monitoring terminal and the second switch coupling the output of the voltage-to-current converter to the external set resistor terminal in the current output mode; and the first switch coupling the reference current source of the current mirror to the second input of the amplifier and the second switch coupling the output of the voltage-to-current converter to an output current monitoring terminal in the voltage output mode.

3. The integrated driver circuit according to claim 1, wherein the current mirror comprises multiple current legs having transistors, the transistors all having the same gate bias, and at least one of said current legs being connected to supply the reference current to the external set resistor.

4. The integrated driver circuit according to claim 3, wherein all other current legs are coupled to a mirror output terminal to mirror the reference current; and the mirror output terminal is coupled to the amplifier.

5. The integrated driver circuit according to claim 4, wherein a clock-controlled switching arrangement is adapted to permutate the at least one current leg coupled to supply the reference current, among all of the current legs in the current mirror.

6. The integrated driver circuit according to claim 1, wherein the voltage-to-current converter has two input terminals adapted to couple to a scale resistor for setting the voltage output scale independently from the current output scale.

7. The integrated driver circuit according to claim 1, wherein the digitally configurable circuit is configured via an interface for remote control purposes.

8. The integrated driver circuit according to claim 1, wherein the integrated circuit driver is configured for fault or load impedance monitoring purposes.

9. The integrated driver circuit according to claim 1, wherein the interface comprises the functionality to switch off the device.

10. An integrated driver circuit structure that is digitally configurable to operate in a current output mode or in a voltage output mode, with its output level controlled by an external voltage applied to a control terminal; wherein:
    the external control voltage determines the current available at an output terminal in the current output mode and the external control voltage determines the voltage available at the output terminal in the voltage output mode;
    the integrated circuit comprises an operational amplifier, a voltage-to-current converter and a current mirror;
    a first input of the operational amplifier is coupled to the control terminal;
    the voltage-to-current converter has voltage sense inputs coupled to respective terminals across which an external load is connected;
    in the current output mode, a second input of the operational amplifier is coupled to a reference current source of the current mirror and to a terminal to which an external set resistor is connected, the output of the operational amplifier supplying a gate bias to the current mirror and the current mirror mirroring the reference current to the output terminal;
    in the voltage output mode, the second input of the operational amplifier is coupled to the output of the voltage-to-current converter and the output of the operational amplifier drives the output terminal to set the voltage across the load; and
    the current mirror includes multiple current sources having a same gate bias supplied by the output of the operational amplifier, at least one of the current sources being connected to supply the reference current to the external set resistor, and other current sources being connected to the output terminal to mirror the reference current.

11. A method of providing a current output or a voltage output responsive to an input signal, the method comprising the steps of:
    applying digital bits to select a current output mode or a voltage output mode;
    applying the input signal to a first input of an amplifier for regulating a voltage across a resistive element coupled to a second input of the amplifier;
    generating a reference current through the resistive element and a current mirrors;
    mirroring the reference current to the amplifier to provide the current output during the current output mode;
    generating a reference voltage using a voltage-to-current converter at the second input of the amplifier to provide the voltage output during the voltage output mode; and
    using the voltage-to-current converter to sense the voltage output or current output during the voltage output mode or current output mode, respectively.

12. The method of claim 11, further comprising the steps of:
    providing closed feedback by including the voltage-to-current converter in a loop during the voltage output mode; and using the voltage-to-current converter outside the loop for monitoring during the current output mode.

13. The method of claim 12, further comprising the step of adjusting a gain of the voltage-to-current converter via a second resistive element.

14. The method of claim 11, further comprising the step of providing closed feedback by including the current mirror in the loop during the current output mode; and using the voltage-to-current converter for monitoring during the current output mode.

15. The method of claim 14, further comprising the step of applying a clock-controlled switching arrangement to switch among current legs of the current mirror to couple at least one current leg to the reference current; and mirroring the reference current through other current legs in the current mirror.

16. The method of claim 15, further comprises the step of permututating among the current legs of the current mirror to provide dynamic element matching, whereby mismatches among current legs are reduced.

* * * * *